US012469775B2

(12) United States Patent
Chae et al.

(10) Patent No.: US 12,469,775 B2
(45) Date of Patent: Nov. 11, 2025

(54) SEMICONDUCTOR PACKAGE INCLUDING SUBSTRATE HAVING A DUMMY PATTERN BETWEEN PADS

(71) Applicant: SAMSUNG ELECTRONICS CO., LTD., Suwon-si (KR)

(72) Inventors: Seunghun Chae, Sejong-si (KR); Youngkwan Seo, Hwaseong-si (KR); Jaeean Lee, Suwon-si (KR); Soyeon Moon, Suwon-si (KR); Hyeyeong Jo, Suwon-si (KR); Iljong Seo, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 616 days.

(21) Appl. No.: 17/885,664

(22) Filed: Aug. 11, 2022

(65) Prior Publication Data

US 2022/0384329 A1   Dec. 1, 2022

Related U.S. Application Data

(63) Continuation of application No. 16/991,306, filed on Aug. 12, 2020, now Pat. No. 11,417,595.

(30) Foreign Application Priority Data

Dec. 11, 2019   (KR) ........................ 10-2019-0164467

(51) Int. Cl.
  *H01L 23/498*   (2006.01)
  *H01L 21/48*   (2006.01)
  (Continued)

(52) U.S. Cl.
  CPC .... *H01L 23/49838* (2013.01); *H01L 21/4853* (2013.01); *H01L 21/4857* (2013.01);
  (Continued)

(58) Field of Classification Search
  CPC ..... H01L 23/498–49894; H01L 23/538–5389; H01L 21/4846–4867
  See application file for complete search history.

(56) References Cited

U.S. PATENT DOCUMENTS 8,558,383 B2   10/2013   Lin et al.
9,922,845 B1   3/2018   Shih
  (Continued)

FOREIGN PATENT DOCUMENTS

CN   106129030 A   11/2016
CN   106653703 A   5/2017
  (Continued)

*Primary Examiner* — Kevin Parendo
(74) *Attorney, Agent, or Firm* — Muir Patent Law, PLLC

(57) ABSTRACT

A semiconductor package includes a redistribution substrate having first and second surfaces, and an insulating member and a plurality of redistribution layers on different levels in the insulating member and electrically connected together; a plurality of under bump metallurgy (UBM) pads in the insulating member and connected to a redistribution layer, among the plurality of redistribution layers, adjacent to the first surface, the UBM pads having a lower surface exposed to the first surface of the redistribution substrate; a dummy pattern between the UBM pads in the insulating member, the dummy pattern having a lower surface located at a level higher than the lower surface of the UBM pads; and at least one semiconductor chip on the second surface of the redistribution substrate and having a plurality of contact pads electrically connected to a redistribution layer, among the plurality of redistribution layers, adjacent to the second surface.

16 Claims, 20 Drawing Sheets

(51) Int. Cl.
*H01L 21/56* (2006.01)
*H01L 23/31* (2006.01)
*H01L 23/367* (2006.01)
*H01L 25/065* (2023.01)

(52) U.S. Cl.
CPC ........ *H01L 21/568* (2013.01); *H01L 23/3128* (2013.01); *H01L 23/367* (2013.01); *H01L 23/49822* (2013.01); *H01L 23/49894* (2013.01); *H01L 25/0655* (2013.01); *H01L 2924/18161* (2013.01)

(56) References Cited

U.S. PATENT DOCUMENTS

| | | | |
|---|---|---|---|
| 10,276,506 | B2 | 4/2019 | Chiu et al. |
| 10,354,961 | B2 | 7/2019 | Yu et al. |
| 10,916,488 | B2 | 2/2021 | Lin et al. |
| 2011/0031619 | A1 | 2/2011 | Chen et al. |
| 2014/0073087 | A1 | 3/2014 | Huang et al. |
| 2017/0033080 | A1* | 2/2017 | Chen .................. H01L 25/0657 |
| 2017/0256511 | A1 | 9/2017 | Kim et al. |
| 2018/0025986 | A1* | 1/2018 | Chiu ........................ H10D 1/20 257/531 |
| 2018/0102311 | A1 | 4/2018 | Shih |
| 2018/0337148 | A1 | 11/2018 | Baek et al. |
| 2019/0103372 | A1 | 4/2019 | Chen et al. |
| 2019/0122949 | A1 | 4/2019 | Lee |
| 2019/0131221 | A1 | 5/2019 | Lee et al. |
| 2019/0131225 | A1 | 5/2019 | Jeong et al. |
| 2019/0139784 | A1* | 5/2019 | Lin ..................... H01L 21/4846 |
| 2019/0229070 | A1 | 7/2019 | Kwon et al. |
| 2019/0244885 | A1* | 8/2019 | Kim .................. H01L 23/49822 |
| 2019/0252323 | A1 | 8/2019 | Chiu et al. |
| 2021/0127484 | A1* | 4/2021 | Yoon ................. H01L 23/49838 |
| 2021/0233836 | A1* | 7/2021 | Liu ................... H01L 23/49822 |
| 2021/0278457 | A1* | 9/2021 | Wang .................. H01L 21/6835 |

FOREIGN PATENT DOCUMENTS

| | | |
|---|---|---|
| TW | 201142998 A | 12/2011 |
| TW | 201411745 A | 3/2014 |
| TW | 201740532 A | 11/2017 |
| TW | 201742170 A | 12/2017 |
| TW | 201814843 A | 4/2018 |
| TW | 201818520 A | 5/2018 |
| TW | 201901864 A | 1/2019 |
| TW | 201917862 A | 5/2019 |
| TW | 201935628 A | 9/2019 |

* cited by examiner

III-III'

SEMICONDUCTOR PACKAGE INCLUDING SUBSTRATE HAVING A DUMMY PATTERN BETWEEN PADS

CROSS-REFERENCE TO RELATED APPLICATIONS

This is a continuation application based on pending application Ser. No. 16/991,306, filed on Aug. 12, 2020, the entire contents of which is hereby incorporated by reference.

Korean Patent Application No. 10-2019-0164467, filed on Dec. 11, 2019, in the Korean Intellectual Property Office, and entitled: "Semiconductor Package and Method of Manufacturing the Same," is incorporated by reference herein in its entirety.

BACKGROUND

1. Field

Embodiments relate to a semiconductor package and a method of manufacturing the same.

2. Description of the Related Art

A semiconductor package implements a semiconductor chip such as an integrated circuit in a form suitable for use in electronic products. Semiconductor packages have been developing in pursuit of miniaturization, weight reduction, and reduction of manufacturing costs.

SUMMARY

Embodiments are directed to a semiconductor package, including: a redistribution substrate having first and second surfaces, disposed opposite to each other, and including an insulating member and a plurality of redistribution layers disposed on a plurality of different levels in the insulating member, respectively, and electrically connected to each other; a plurality of under bump metallurgy (UBM) pads disposed in the insulating member and connected to a redistribution layer, among the plurality of redistribution layers, that is adjacent to the first surface of the redistribution substrate, the plurality of UBM pads having a lower surface exposed to the first surface of the redistribution substrate; a dummy pattern disposed between the plurality of UBM pads in the insulating member, the dummy pattern having a lower surface located at a level that is higher than the lower surface of the plurality of UBM pads; and at least one semiconductor chip disposed on the second surface of the redistribution substrate and having a plurality of contact pads electrically connected to a redistribution layer, among the plurality of redistribution layers, that is adjacent to the second surface of the redistribution substrate.

Embodiments are also directed to a semiconductor package, including: a redistribution substrate having first and second surfaces disposed opposite to each other, and including a plurality of insulating layers and a plurality of redistribution layers disposed between the plurality of insulating layers, respectively; a plurality of under bump metallurgy (UBM) pads disposed in an insulating layer, among the plurality of insulating layers, that is adjacent to the first surface of the redistribution substrate, the plurality of UBM pads having a lower surface exposed to the first surface of the redistribution substrate and having a concave upper surface; a dummy pattern disposed on an adjacent insulating layer of the plurality of insulating layers, the dummy pattern having a lower surface located at a level that is higher than the lower surface of the plurality of UBM pads and having a convex upper surface; and at least one semiconductor chip disposed on the second surface of the redistribution substrate, and having a contact pad that is electrically connected to a redistribution layer of the plurality of redistribution layers.

Embodiments are also directed to a semiconductor package, including: a redistribution substrate having first and second surfaces disposed opposite to each other, and including an insulating member and a plurality of redistribution layers disposed on a plurality of different levels in the insulating member, respectively, to be electrically connected thereto; a plurality of under bump metallurgy (UBM) pads disposed in the insulating member to be exposed to the first surface of the redistribution substrate, and connected to a redistribution layer, among the plurality of redistribution layers, that is adjacent to the first surface of the redistribution substrate; a first dummy pattern spaced apart from the first surface of the redistribution substrate, and disposed between the plurality of UBM pads, the first dummy pattern having a thickness that is less than respective thicknesses of the plurality of UBM pads; and at least one semiconductor chip disposed on the second surface of the redistribution substrate, the at least one semiconductor chip having a plurality of contact pads electrically connected to a redistribution layer, among the plurality of redistribution layers, that is adjacent to the second surface of the redistribution substrate.

Embodiments are also directed to a method of manufacturing a semiconductor package, the method including: manufacturing a redistribution substrate; and disposing a semiconductor chip on the redistribution substrate. Manufacturing the redistribution substrate may include forming a first insulating film having a plurality of first openings; forming a first photoresist film having an opening overlapping the plurality of first openings, respectively, on the first insulating film; forming first metal patterns in the plurality of first openings, respectively; removing the first photoresist film, and forming a second photoresist film having a plurality of second openings in which the first metal pattern is opened, on the first insulating film, and a third opening disposed between the plurality of the second openings; forming second metal patterns in the plurality of second openings and the third opening, respectively; and removing the second photoresist film, and forming a second insulating film on the first insulating film to cover the second metal patterns. The first metal patterns of the plurality of first openings and the second metal patterns of the plurality of second openings may be provided as a plurality of under bump metallurgy (UBM) pads, and the second metal patterns of the third opening are provided as dummy patterns.

Embodiments are also directed to a method of manufacturing a semiconductor package, the method including: manufacturing a redistribution substrate; and disposing a semiconductor chip on the redistribution substrate. The manufacturing the redistribution substrate may include: forming a first insulating film having a plurality of first openings; forming a photoresist film having a plurality of second openings overlapping the plurality of first openings, respectively, on the first insulating film, and an opening for dummy pattern disposed between the second openings, the plurality of overlapping first and second openings providing a plurality of openings for under bump metallurgy (UBM) pads, respectively; forming a plurality of UBM pads and a dummy pattern in the opening for the plurality of UBMs and the opening for dummy pattern, respectively; and removing the photoresist film, and forming a second insulating film on the first insulating film to cover the plurality of UBM pads and the dummy pattern.

BRIEF DESCRIPTION OF DRAWINGS

Features will become apparent to those of skill in the art by describing in detail example embodiments with reference to the attached drawings in which.

DETAILED DESCRIPTION

Figure 1:
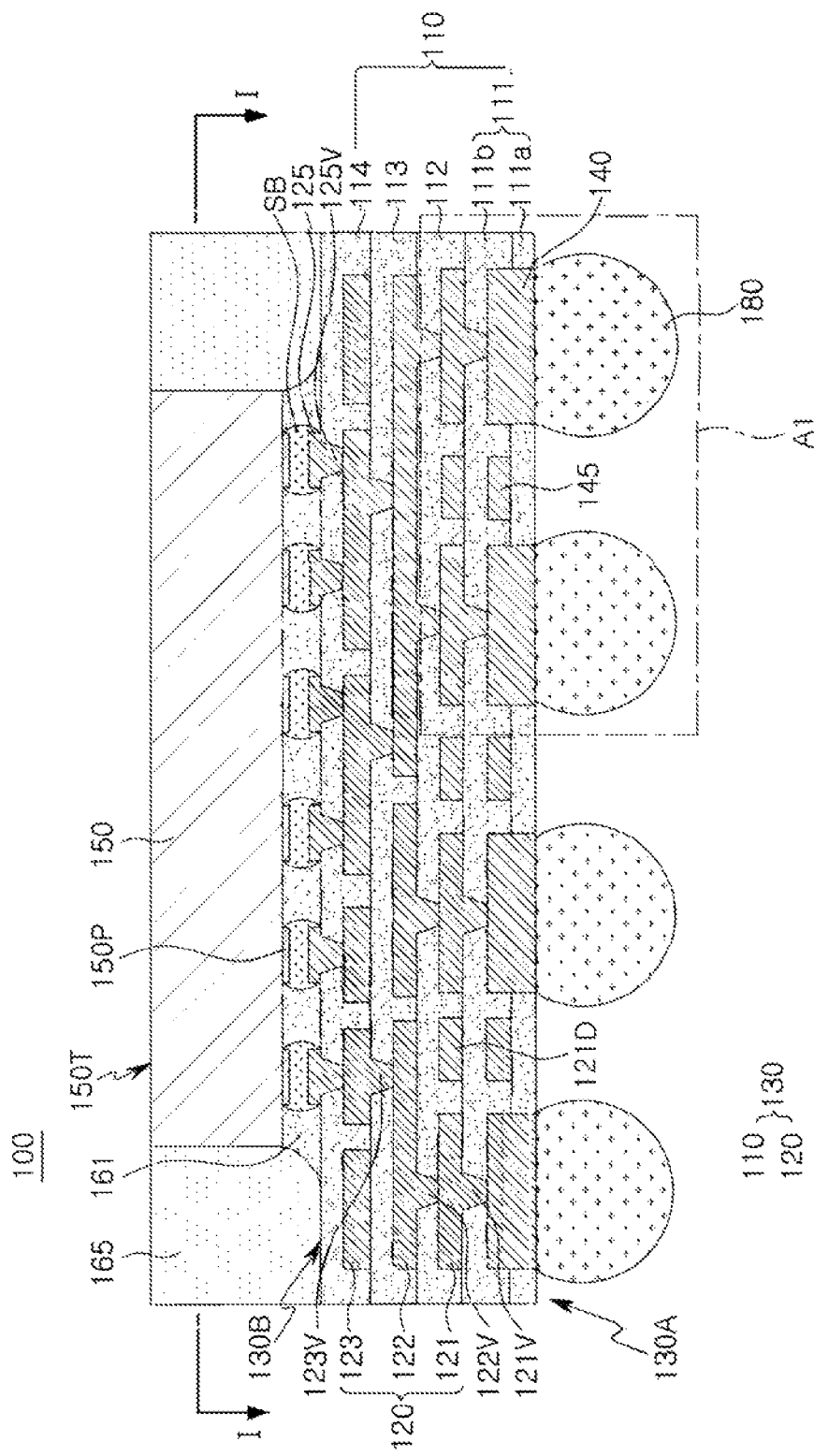
FIG. 1 is a cross-sectional view illustrating a semiconductor package according to an example embodiment.
Figure 2:
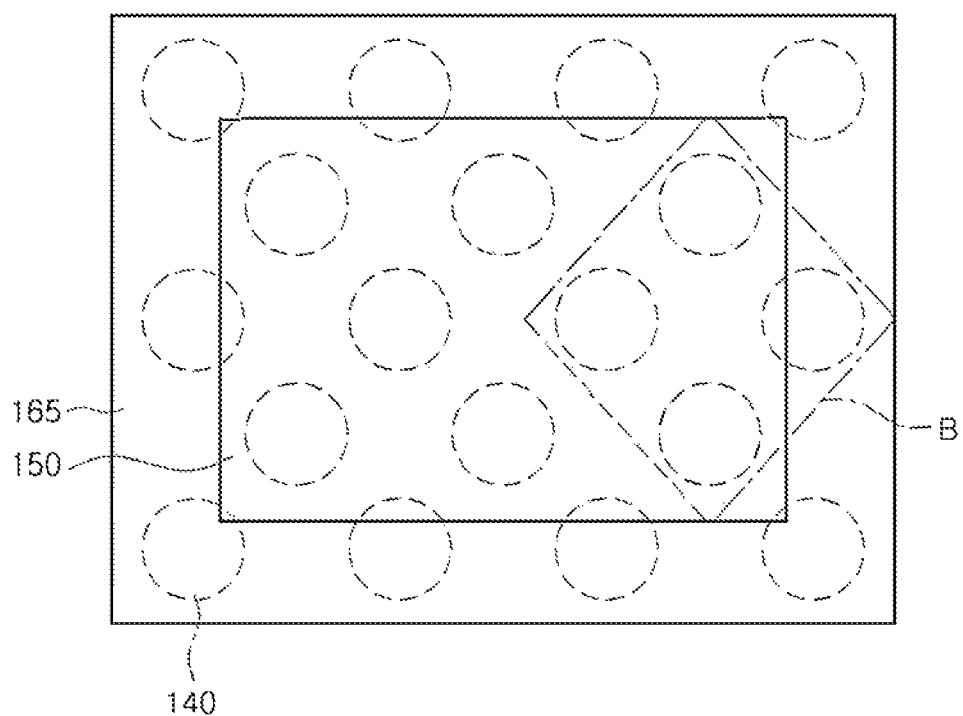
FIG. 2 is a plan view of the semiconductor package illustrated in FIG. 1 taken along line I-I'.

FIG. 1 is a cross-sectional view illustrating a semiconductor package according to an example embodiment, and FIG. 2 is a plan view of the semiconductor package illustrated in FIG. 1 taken along line I-I'.

Referring to FIGS. 1 and 2, a semiconductor package 100 according to the present example embodiment includes a redistribution substrate 130 having a first surface 130A and a second surface 130B opposite to each other, under-bump metallurgy (UBM) pads disposed on the first surface 130A of the redistribution substrate 130, and a semiconductor chip 150 disposed on the second surface 130B of the redistribution substrate 130.

The semiconductor chip 150 may include a semiconductor substrate having an active surface on which various individual elements are formed, and an inactive surface opposite to the active surface. The semiconductor substrate may include a single element semiconductor formed of a material such as silicon (Si) or germanium (Ge) or a compound semiconductor formed of a material such as silicon carbide (SiC), gallium arsenide (GaAs), indium arsenide (InAs) or indium phosphide (InP). In an example embodiment, the semiconductor substrate may have a silicon on insulator (SOI) structure. For example, the semiconductor substrate constituting the semiconductor chip 150 may include a buried oxide (BOX) layer. The various individual devices may include, e.g., metal-oxide-semiconductor field effect transistors (MOSFETs) such as complementary metal-insulator-semiconductor (CMOS) transistors and/or an image sensor such as a system large scale integration (LSI) or CMOS imaging sensors (CIS).

The semiconductor chip 150 may include a plurality of contact pads 150P electrically connected to the individual elements and disposed on the active surface. The semiconductor chip 150 may be a memory chip or a logic chip. For example, the memory chip may be a volatile memory chip such as a dynamic random access memory (DRAM) (e.g., high bandwidth memory (HBM)) or a static random access memory (SRAM), or a phase-change random access memory (PRAM), or a nonvolatile memory chip such as a magnetoresistive random access memory (MRAM), a ferroelectric random access memory (FeRAM), or a resistive random access memory (RRAM). In addition, the logic chip may be, e.g., a microprocessor, an analog device, or a digital signal processor.

As shown in FIG. 1, the redistribution substrate 130 includes an insulating member 110 and a redistribution structure 120 disposed on different levels from the insulating member 110. The insulating member 110 includes a plurality of insulating layers 111, 112, 113, and 114, and the redistribution structure 120 includes a plurality of redistribution layers 121, 122, and 123 disposed at interfaces of the plurality of insulating layers 111, 112, 113, and 114, respectively. The redistribution substrate 130 may be used as an interposer for packaging the semiconductor chip 150 to be mounted on the main board.

An interface of the plurality of insulating layers 111, 112, 113, 114 defines a location of formation of the redistribution layers 121, 122, and 123, but in a final structure according to an example embodiment (e.g., when the plurality of insulating layers 111, 112, 113, and 114 are formed of the same material), an interface of the insulating layers 111, 112, 113, and 114 may not be directly observed visually. A portion of the plurality of redistribution layers 121, 122, and 123 may include redistribution vias 121V, 122V, and 123V connecting the redistribution layers 121, 122, and 123 disposed at adjacent levels. The redistribution vias 121V, 122V, and 123V have lower widths smaller than the upper widths according to the forming direction. For example, the redistribution vias 121V, 122V, and 123V may have a shape narrowed in a direction from the second surface 130B toward the first surface 130A.

The plurality of insulating layers 111, 112, 113, and 114 may include a resin such as, e.g., epoxy or polyimide. In an example embodiment, the plurality of insulating layers 111, 112, 113, and 114 may be formed of a photoimageable insulating material (PID). The plurality of redistribution layers 121, 122, and 123 may include, e.g., copper, nickel, stainless steel, or beryllium copper or other copper alloy.

The semiconductor chip 150 disposed on the second surface 130B of the redistribution substrate 130 may have a plurality of contact pads 150P electrically connected to the redistribution layer 123 adjacent to the second surface among the plurality of redistribution layers 121, 122, and 123. The redistribution substrate 130 may include a plurality of bonding pads 125 connected to the redistribution layer 123 and disposed on the second surface 130B. The plurality of bonding pads 125 may have a via portion 125V penetrating a portion of the insulating member 110 (that is, the insulating layer 114), respectively, and connected to the redistribution layer 123 adjacent to the second surface 130B. The via portion 125V of bonding pad 125 may have a lower end width that is less than an upper end width, similar to redistribution vias 121V, 122V, 123V. For example, the via portion 125V may have a shape narrowed in a direction from the second surface 130B toward the first surface 130A. The bonding pad 125 may include, e.g., copper, nickel, stainless steel or beryllium copper or other copper alloy, similar to the redistribution layers 121, 122, and 123.

The semiconductor chip 150 may be mounted on the second surface 130B of the redistribution substrate 130. The contact pads 150P of the semiconductor chip 150 may be respectively connected to the bonding pad 125 using connection bumps SB such as solder, respectively. The semiconductor chip 150 may be electrically connected to the redistribution structure 120. The semiconductor package 100 may further include an underfill resin 161 disposed between the active surface of the semiconductor chip 150 and the second surface 130B of the redistribution substrate 130. The underfill resin 161 may be formed to surround side surfaces of the connection bumps SB. The underfill resin 161 may include, e.g., an epoxy resin.

An upper surface 150T of the semiconductor chip 150 may be exposed through an upper surface of the molding portion 165, and heat may be easily released through the exposed upper surfaces of the semiconductor chip 150. The upper surface 150T of the semiconductor chip 150 may be obtained by grinding the upper surface of the molding portion 165. The upper surface 150T of the semiconductor chip 150 may have a coplanar surface that is substantially flat with the upper surface of the molding portion 165. The molding portion 165 may be made of, e.g., a hydrocarbon cyclic compound containing a filler. The filler may be, e.g., an $SiO_2$ filler. In an example embodiment, the molding portion 165 may be formed of Ajinomoto Build-up Film (ABF).

The UBM pads 140 may be disposed on the insulating layer 111 that is a lowermost portion of the insulating member 110, and may be connected to the redistribution layer 121 adjacent to the first surface 130A of the plurality of redistribution layers 121, 122, and 123. At least one surface, e.g., a lower surface of the UBM pads 140, may be exposed to the first surface of the redistribution substrate 130. External connection conductors 180 may be disposed on the exposed lower surface, respectively. An external connection conductor 180 may be attached on the UBM layer of the redistribution substrate 130. The external connection conductor 180 may be, e.g., solder balls or bumps. The external connection conductor 180 may electrically connect the semiconductor package 100 to an external device (e.g., a motherboard).

In the present example embodiment, a dummy pattern 145 may be disposed between the UBM pads 140 in the insulating member 110, e.g., in the lowermost insulating layer 111. A lower surface of the dummy pattern 145 may have a lower surface disposed on a level, higher than the lower surface of the UBM pads 140. The dummy pattern 145 may be disposed in the insulating member 110 (for example, the lowermost insulating layer 111) without being exposed to the outside of the insulating member 110.

Figure 3:
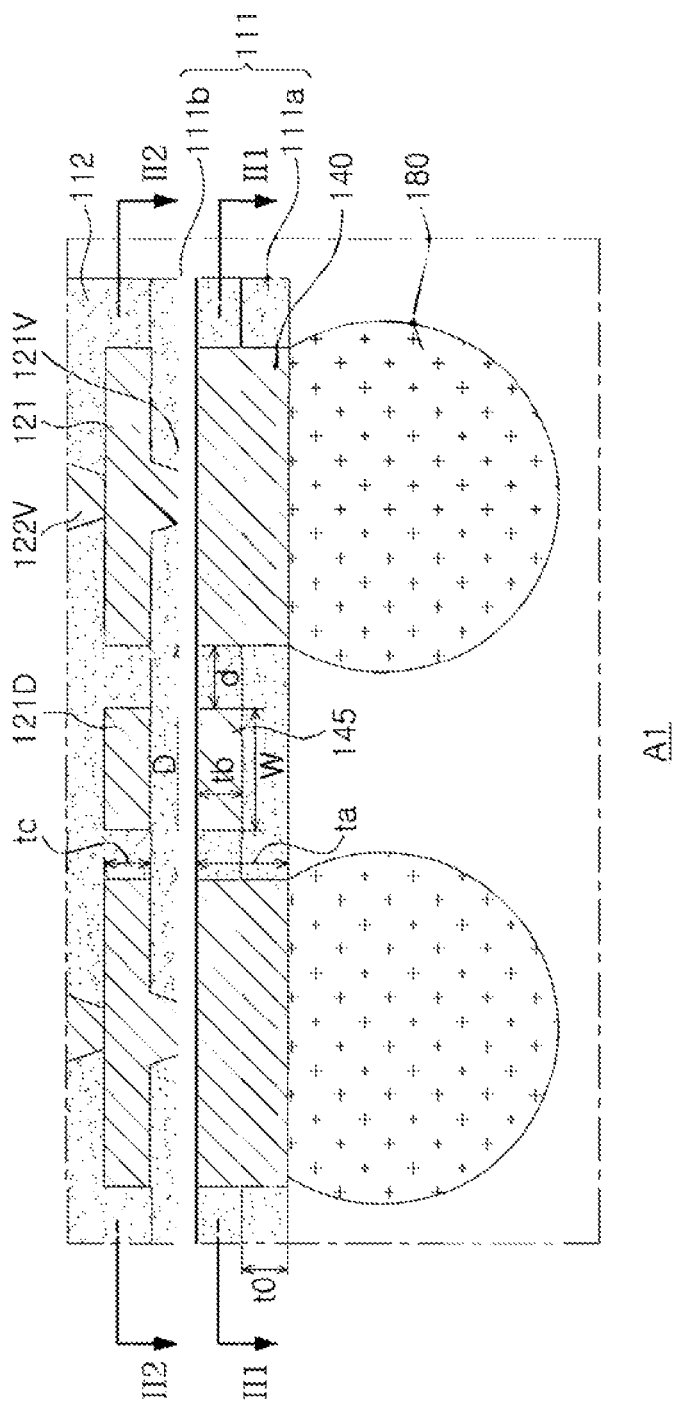
FIG. 3 is an enlarged cross-sectional view of a portion "A1" of the semiconductor package shown in FIG. 1.

Referring to FIG. 3, an arrangement of the UBM pad and the dummy pattern employed in the present example embodiment will be described in detail.

Figure 4:
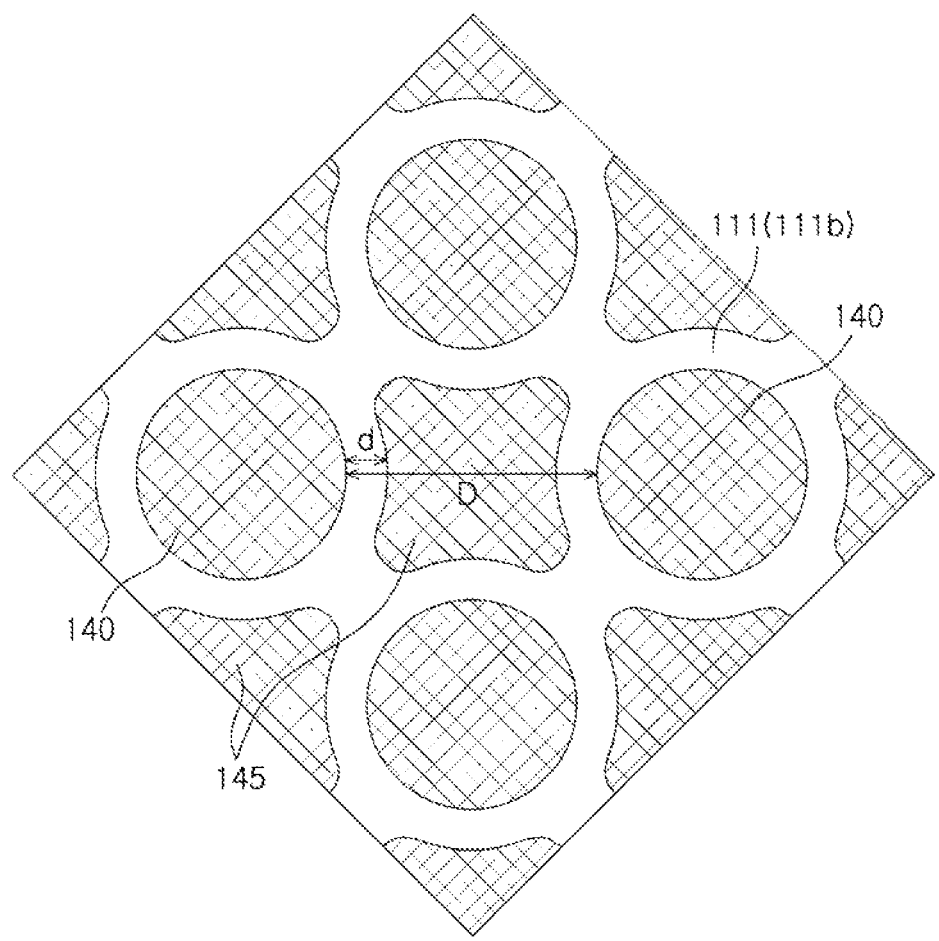
FIG. 4 is a plan view of a connection pad level along line II1-II1' of the "A1" portion of the semiconductor package shown in FIG. 3.
Figure 5:
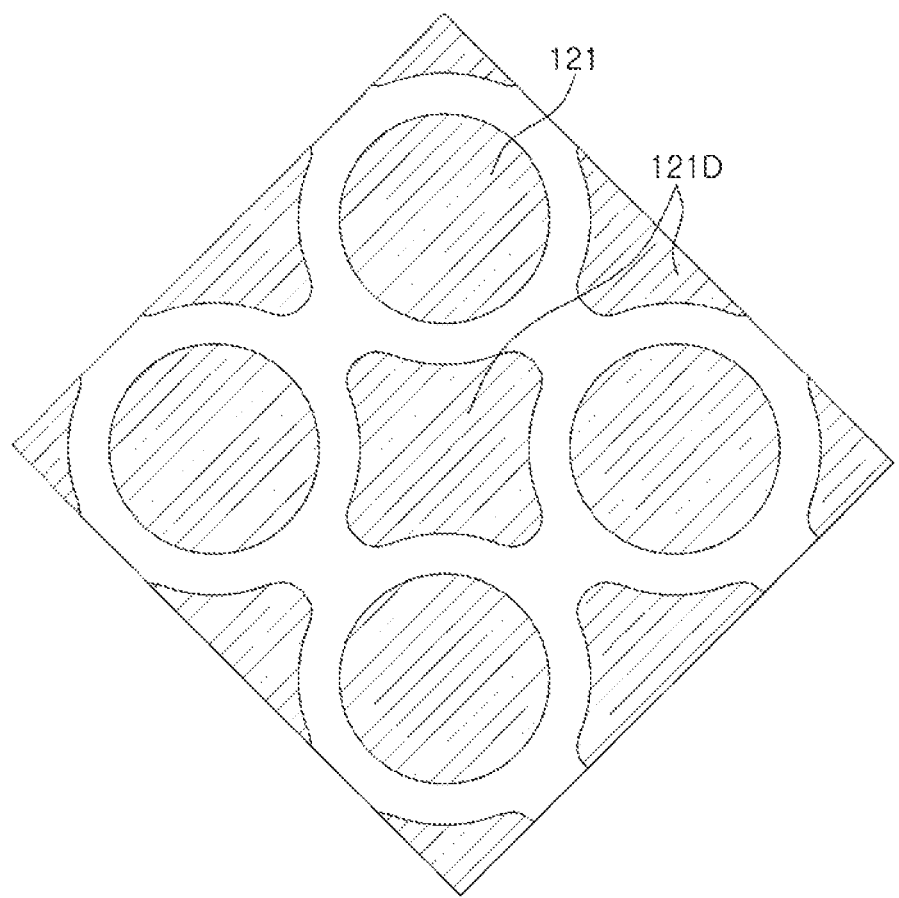
FIG. 5 is a plan view of a connection pad along line II2-II2' of the "A1" portion of the semiconductor package shown in FIG. 3.

FIG. 3 is an enlarged cross-sectional view of portion "A1" of the semiconductor package shown in FIG. 1, and FIGS. 4 and 5 are plan views by cutting portions "A1" of the semiconductor package shown in FIG. 3 taken along the lines II1-II1' and II2-II2', respectively. Planes in FIGS. 4 and 5 may be understood as an area corresponding to "B" in an entire plane of the semiconductor package 100 shown in FIG. 2.

Referring to FIGS. 3 and 4, the dummy pattern 145 may be disposed between the UBM pads 140 to alleviate a cause of undulation of the redistribution layer 121 formed in a subsequent process. The dummy pattern 145 employed in the present example embodiment may be disposed in the lowermost insulating layer 111 on which the UBM pads 140 are disposed.

Figure 6:
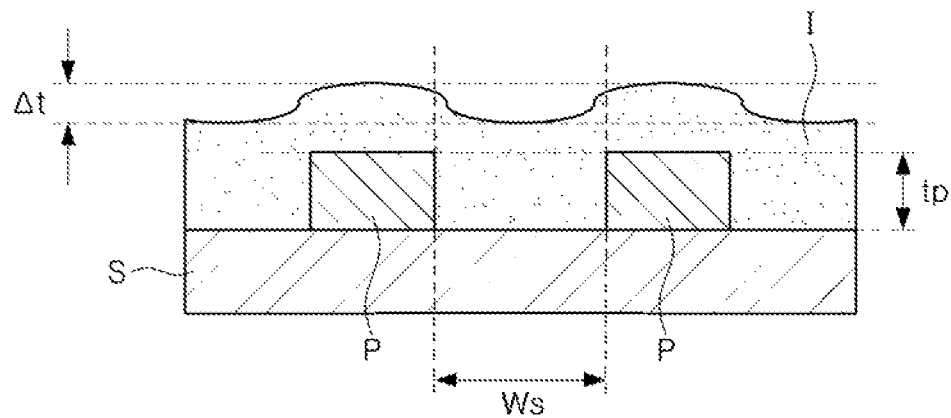
FIG. 6 is a schematic view for explaining a cause of the undulation and an improvement method.

The undulation refers to an upper surface level variation of the cover insulating layer I that covers a conductor pattern P formed on the substrate S as illustrated in FIG. 6, that is, a thickness variation ($\Delta t$) of the cover insulating layer I. When the thickness variation ($\Delta t$) is large, a failure (e.g., short) of a redistribution layer (not shown) to be formed on the cover insulating layer may be caused.

An undulation may occur during a curing shrinkage process of the insulating layer I. Thus, the undulation may become more serious as a shrinkage ratio increases. The shrinkage ratio may be determined by a volume of the cover insulation layer I when the same material is used (under conditions in which the shrinkage ratio of the material is the same), specifically, it may be determined by a width Ws between the pattern P and a thickness of the pattern P.

Figure 7:
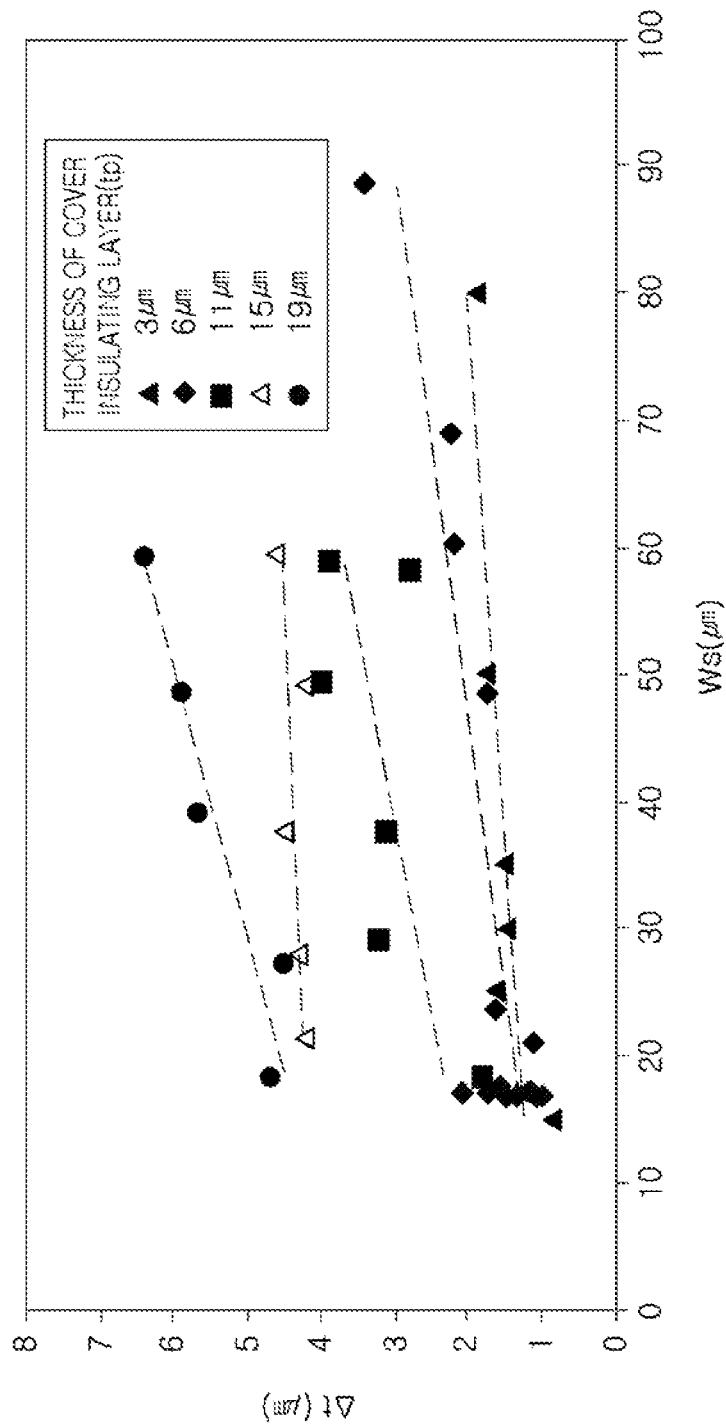
FIG. 7 is a graph comparing a thickness variation (undulation) of a cover insulating layer according to the thickness and the distance of the pattern.

FIG. 7 is a graph comparing a thickness variation (undulation) of a cover insulating layer according to the thickness and the distance of the pattern. Referring to FIG. 7, the thickness deviation $\Delta t$ decreases as the thickness (tp) of the pattern P decreases and as the width (Ws) between the patterns P decreases.

Referring to FIG. 7, the thickness deviation $\Delta t$ decreases as the thickness (tp) of the pattern P decreases and as the width (Ws) between the patterns P decreases. For example, the thickness tc of the redistribution layer 121 may be about 5 μm or less (e.g., about 2 μm to about 4 μm), whereas the thickness (ta) of the UBM pads 140 is about 8 μm or more. Therefore, since the UBM pads 140 are not only disposed at a lowermost portion, but also have a relatively large thickness (ta), the UBM pads 140 serve as a major cause of undulation.

Meanwhile, since the UBM pads 140 should be in contact with external connection conductors 180 for connecting external circuits (e.g., a main board), the UBM pads 140 may be arranged at sufficient distances D. For example, the distance D of the UBM pads 140 may be at least about 50 μm, in some example embodiments, the distance D of the UBM pads 140 may be at least about 100 μm.

Referring to FIG. 6, e.g., when the distance D between the UBM pads 140 is about 50 μm or more and the thickness of the lowermost insulating layer 111 is about 11 μm, the undulation may occur seriously at about 3 μm or more. To prevent this, the dummy pattern 145 is disposed between the UBM pads 140.

According to the width W of the dummy pattern 145, the thickness of the insulating layer 111 is maintained between the patterns (e.g., the UBM pad 140 and the dummy pattern 145)), but the distance d may be largely reduced. As such, even if the thickness of the lowermost insulating layer 111 is large (e.g., about 11 μm), the distance d between the UBM pad 140 and the dummy pattern 145 is reduced, so that the undulation can be significantly reduced. For example, referring to FIG. 6, by reducing the distance d between the UBM pad 140 and the dummy pattern 145 to about 30 μm or less, an effect of reducing the undulation may be expected. In particular, when the distance d is about 20 μm or less, the thickness deviation Δt due to the undulation may be reduced to less than 2 μm.

In addition, the dummy pattern 145 may be disposed in the lowermost insulating layer 111 so as not to be exposed to the first surface 130A of the redistribution substrate 130. Thus, the lowermost insulating layer 111 associated with the UBM pad 140 may be formed by being divided into a first insulating film 111a and a second insulating film 111b. The first insulating film 111a protects the dummy pattern 145 from being exposed to the outside, and the thickness (t0) of the first insulating film 111a may be sufficient to ensure stable insulation. For example, the thickness t0 of the first insulating film 111a may be about 2 μm or more. The thickness t0 may define a level difference between the bottom surface of the UBM pad 140 and the bottom surface of the dummy pattern 145.

In the present example embodiment, the UBM pads 140 and the dummy pattern 145 may have a substantially flat upper surface, respectively. A thickness (tb) of the dummy pattern 145 may almost correspond to thicknesses (ta–t0), that is, excluding or subtracting the thickness (t0) of the first insulating film 111a from the thickness (ta) of the UBM pad 140. Such a structure may be formed by processes set forth below in connection with FIGS. 8A to 8G according to an example embodiment (in contrast to the processes set forth below in connection with FIGS. 10A to 10D according to another example embodiment).

The UBM pad employed in the present example embodiment includes a planar conductive pattern, and may be connected by a redistribution via 121V of the redistribution layer 121 penetrating the lowermost insulating layer 111 (for example, a second insulating film 111b).

In the present example embodiment, a redistribution layer 121 that is closest to the first surface 130A of the plurality of redistribution layers 121, 122, and 123 (that is, a redistribution layer 121 directly connected to the plurality of UBM pads) may be provided to connection pads having the same shape as the plurality of UBM pads 140 to correspond to the plurality of UBM pads 140, respectively, as illustrated in FIG. 5. In addition, an additional dummy pattern 121D may be disposed between the connection pads, and the additional dummy pattern 121D may also have a shape and an area that are substantially the same as the dummy pattern disposed between the UBM pads 140. In another example embodiment, the redistribution layer 121 closest to the first surface 130A may be a portion of a general redistribution structure, such as a line pattern, instead of connection pads.

FIGS. 8A to 8G are cross-sectional views of stages in a method of manufacturing a redistribution substrate according to an example embodiment.

The present example embodiment may be used to manufacture the redistribution substrate of the semiconductor package of FIG. 1, and may be understood as a process diagram of an "A1" portion of FIG. 1, that is, a portion corresponding to FIG. 3.

Figure 8A:
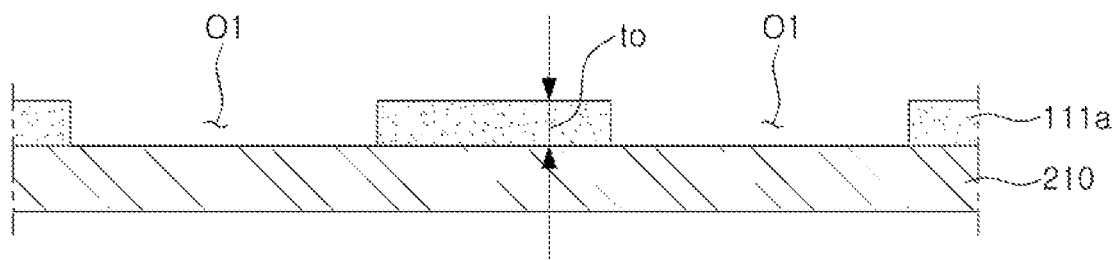
FIGS. 8A to 8G are cross-sectional views of stages in a method of manufacturing a redistribution substrate according to an example embodiment.

Referring to FIG. 8A, a first insulating film having a plurality of first openings may be formed.

A carrier 210 may be provided as a substrate for building up the redistribution structure. A first insulating film 111a may be formed on the carrier 210, and a plurality of first openings O1 for UBM pads (for example, a lower region of the UBM pads) may be formed in the first insulating film 111a. In the present example embodiment, a formation process of the UBM pad may use a plating process twice. The first opening O1 of the first insulating film 111a may define a lower region of the UBM pad, and the first insulating film 111a may be formed to have a thickness (t0) that is less than a desired thickness of the UBM pad (ta of FIG. 3). The first insulating film 111a may include a resin such as epoxy or polyimide. For example, the first insulating film 111a may include a photosensitive insulating material PD. When PID is used as the first insulating film 111a, the first opening O1 may be formed using a photolithography process.

Figure 8B:
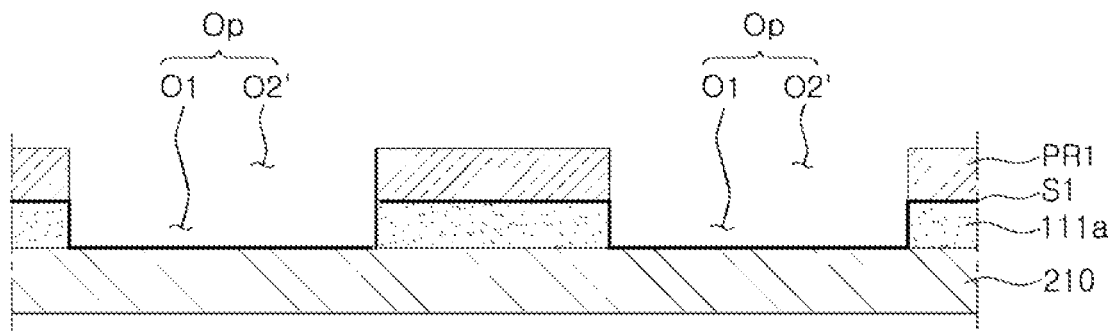

Referring to FIG. 8B, a first photoresist film PR1 having openings O2' overlapping the plurality of first openings O1, respectively, may be formed on the first insulating film 111a.

Before forming the first photoresist film PR1, a first seed layer S1 for the plating process may be formed on an upper surface of the first insulating film 111a and surfaces exposed to the first opening O1. For example, the first seed layer S1 may include a Ti/Cu layer. In the first photoresist film PR1, overlapping openings O2' opening a first plating region for the UBM pad may be formed by using a photolithography process. The overlapping openings O2' may be arranged to overlap the first opening O1.

Figure 8C:
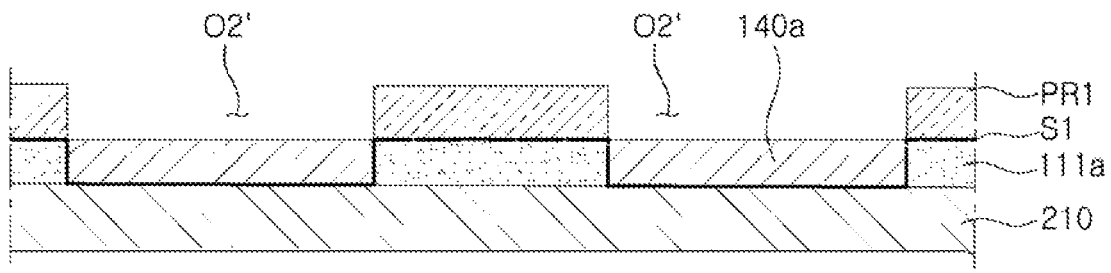

Referring to FIG. 8C, first metal patterns 140a may be formed in the plurality of first openings O1, respectively.

The first metal pattern 140a (also referred to as a 'lower region of the UBM pad') may be formed by a plating process using the first photoresist film PR1 and the first seed layer S1. The first metal pattern 140a may include, e.g., copper. The present plating process may be a primary plating process for the UBM pad. In the present plating process, at least a portion of the plurality of first openings O1 may be filled by the first metal pattern 140a, while at least a portion of the overlapping opening O2' may not be filled. The present plating process may be performed by, e.g., immersion plating, electroless plating or electroplating.

Figure 8D:
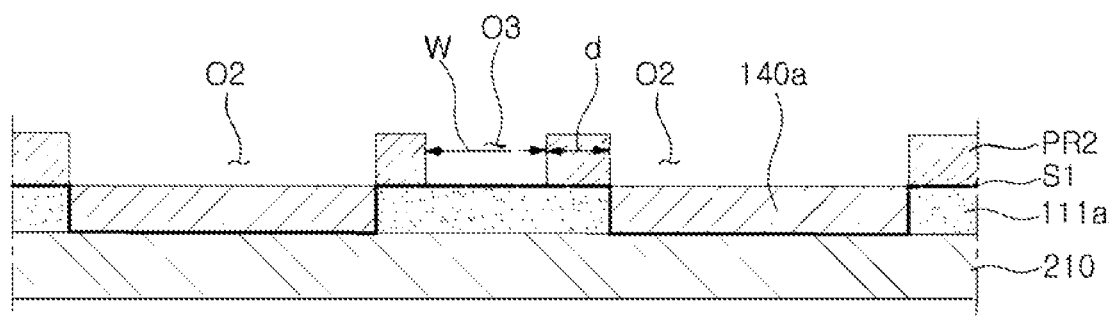

Referring to FIG. 8D, after removing the first photoresist film PR1, a second photoresist film PR2 having a plurality of second openings O2 (openings for the plurality of first metal patterns 140a) and a third opening O3 between the second openings O2 may be formed on the first insulating film 111a.

The second photoresist film PR2 may be formed on the first insulating film 111a, on which a plurality of first metal patterns 140a are formed and from which the first photoresist film PR1 is removed. The plurality of second openings O2 (opening the plurality of first metal patterns 140a, respectively) and a third opening O3 between the plurality of second openings O2 may be formed in the second photoresist film PR2 using a photolithography process. The second openings O2 may have a size corresponding to the first openings O1. The third opening O3 may define a region for forming a dummy pattern (145 of FIG. 3), and some regions of the first seed layer S1 disposed on the first insulating film 111a may be opened through the third opening O3.

Figure 8E:
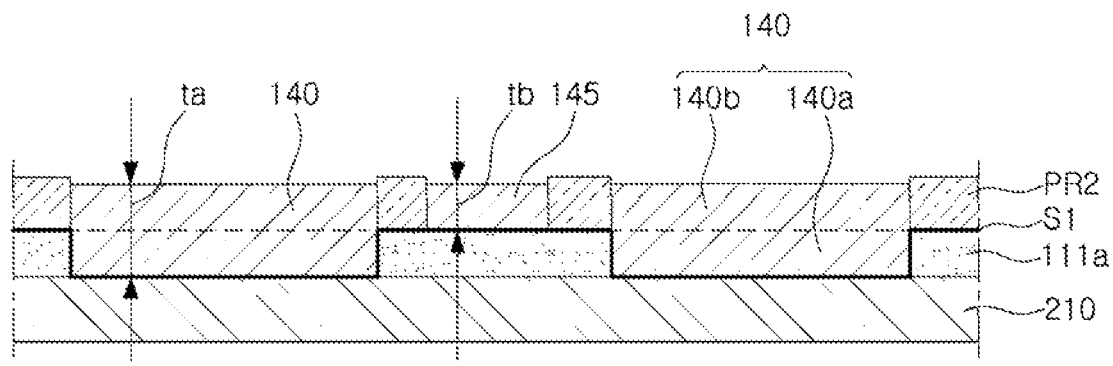

Referring to FIG. 8E, second metal patterns 140b and 145 may be formed in the plurality of second openings O2 and the third openings O3, respectively.

The second metal patterns 140b and 145 may be formed by a plating process using the second photoresist film PR2. In the present plating process, not only the region of the seed layer S1 exposed by the third opening O3, but also the first metal pattern 140a formed in advance may operate as a seed. The present plating process may be a secondary plating process for forming an upper region (corresponding to '140b' among the second metal patterns) of the UBM pad. In the present secondary plating process, a dummy pattern (corresponding to 145 among the second metal patterns) may be formed in the third opening O3. The present plating process may be performed by, e.g., immersion plating, electroless plating or electroplating, similarly to the primary plating process.

Figure 8F:
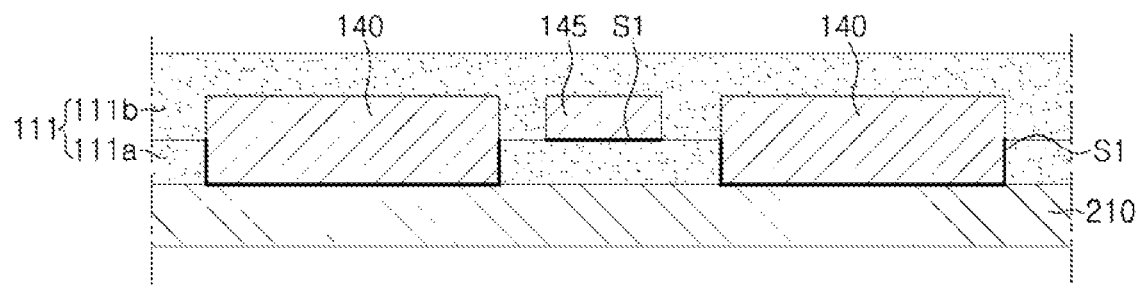

Referring to FIG. 8F, the second photoresist film PR2 may be removed, and a second insulating film 111b may be formed on the first insulating film 111a to cover the second metal patterns 140b and 145.

The second insulating film 111b may be provided as a lowermost insulating layer 111 related to the UBM pad 140 together with the first insulating film 111a. For example, the second insulating film 111b may be a PID material similar to the first insulating film 111a. The first metal patterns 140a of the plurality of first openings O1 and the second metal patterns 140b of the plurality of second openings O2 may be provided as the plurality of UBM pads 140, and the second metal patterns 145 of the third opening O3 may be provided as the dummy pattern 145.

Figure 8G:
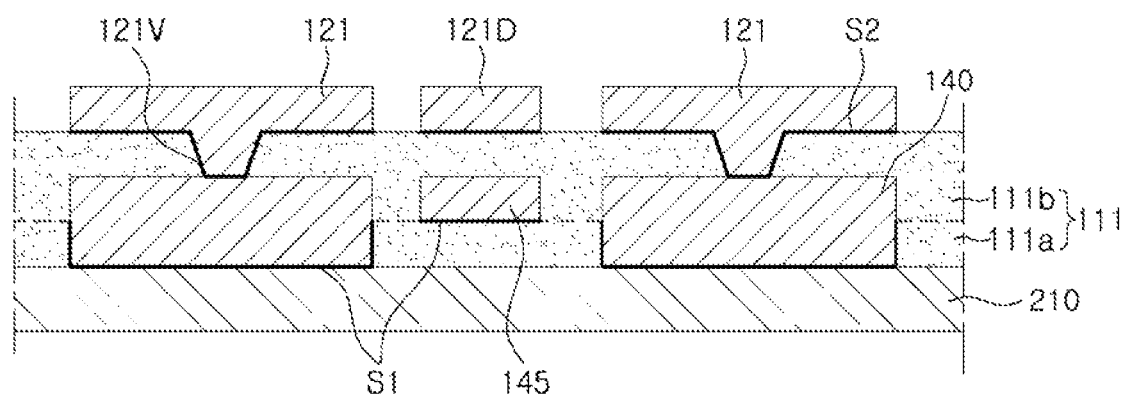

Referring to FIG. 8G, a redistribution layer 121 connected to the UBM pad 140 may be formed on the second insulating film 111b.

When the second insulating film 111b is PID, the redistribution layer 121 connected to the UBM pad 140 may be formed using a photolithography process and a plating process. For example, a hole connected to the UBM pad 140 may be formed for a photolithography process, a redistribution via 121V may be formed in the hole using a plating process, and a redistribution layer 121 connected to the redistribution via 121V may be formed in the second insulating film 111b.

When the second insulating film 111b is not PID, a process of forming the hole in the second insulating film 111b may be formed by, e.g., a laser drilling method using a UV laser or an Excimer laser.

As shown in FIG. 8G, a second seed layer S2 for the plating process may remain in the redistribution layer 121 along a surface in contact with the second insulating film 111b. In the present example embodiment, the first seed layer S1 may not be disposed on the surface of the upper region 140b of the UBM pad 140, but may be disposed only on the surface of the lower region 140a of the UBM pad 140. Thus, the first seed layer S1 for the UBM pad 140 according to the present example embodiment may be disposed between the plurality of UBM pads 140 and the first insulating film 111a, but the first seed layer S1 may not be present between the plurality of UBM pads 140 and the second insulating film 111b.

In addition, a portion of the first seed layer S1 for the dummy pattern 145 may be disposed between the dummy pattern 145 and the first insulating film 111a, but may not be present between the dummy pattern 145 and the second insulating film 111b.

Figure 9A:
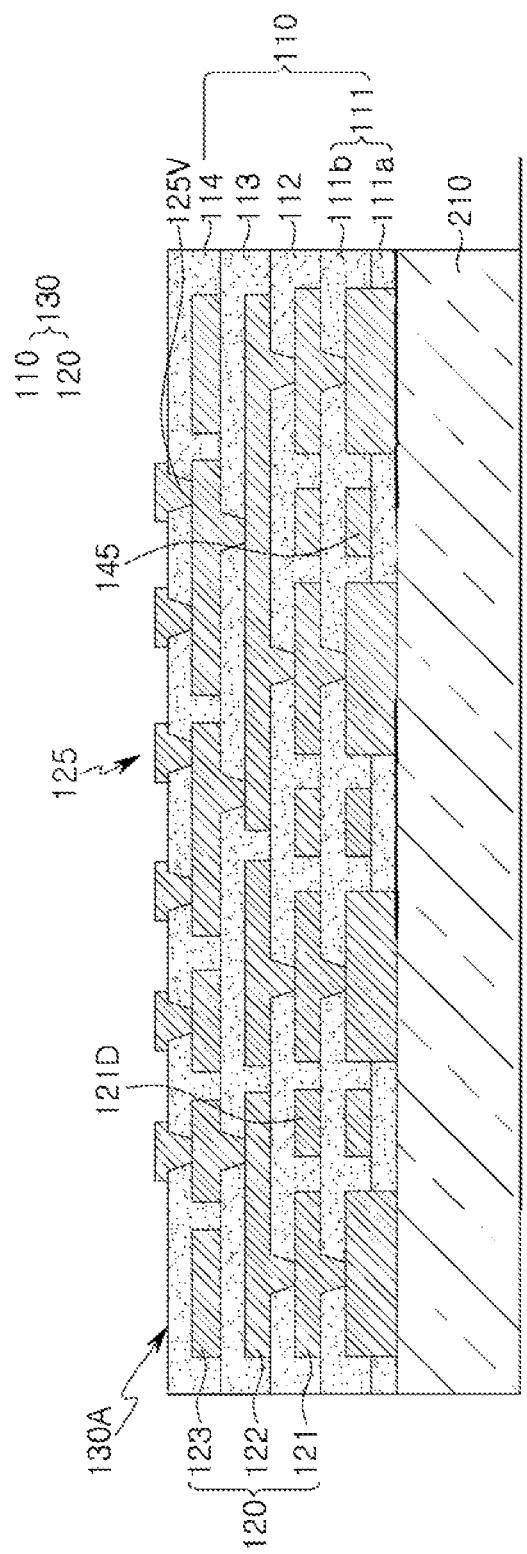
FIGS. 9A to 9C are cross-sectional views of stages in a method of manufacturing a semiconductor package according to an example embodiment.

The redistribution substrate 130 illustrated in FIG. 9A may be formed by repeatedly performing the formation process of the insulating layers 112, 113, and 114, and the redistribution layers 122, 123, and 125, described above (the process of FIG. 8G).

In the process illustrated in FIG. 8G, the first and second photoresist films PR1 and PR2 used in each plating process are illustrated as using a negative-type photoresist. Thus, the first photoresist film PR1 may be cured at a time of exposure, and the first photoresist film PR1 may be peeled off and removed for an additional plating process (see, FIG. 8E) after the primary plating process (see, FIG. 8C), and the second photoresist film PR2 may be formed. In another example embodiment, when a positive-type photoresist is used as the first photoresist film PR1, only the exposed portion is developed, so that the first photoresist PR1 may not be peeled off, and an exposure/development process may be applied to the first photoresist PR1 to directly form the third opening (O3 of FIG. 8D).

Figure 9B:
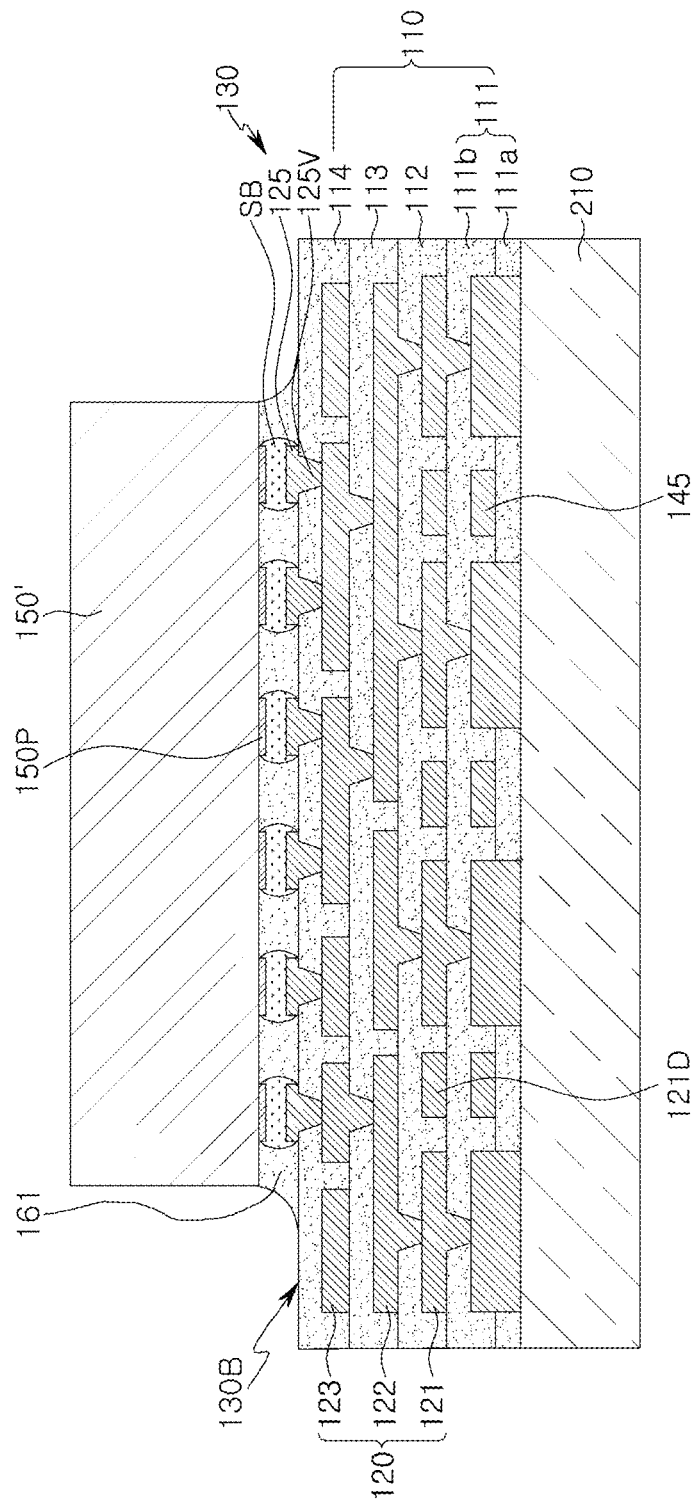
Figure 9C:
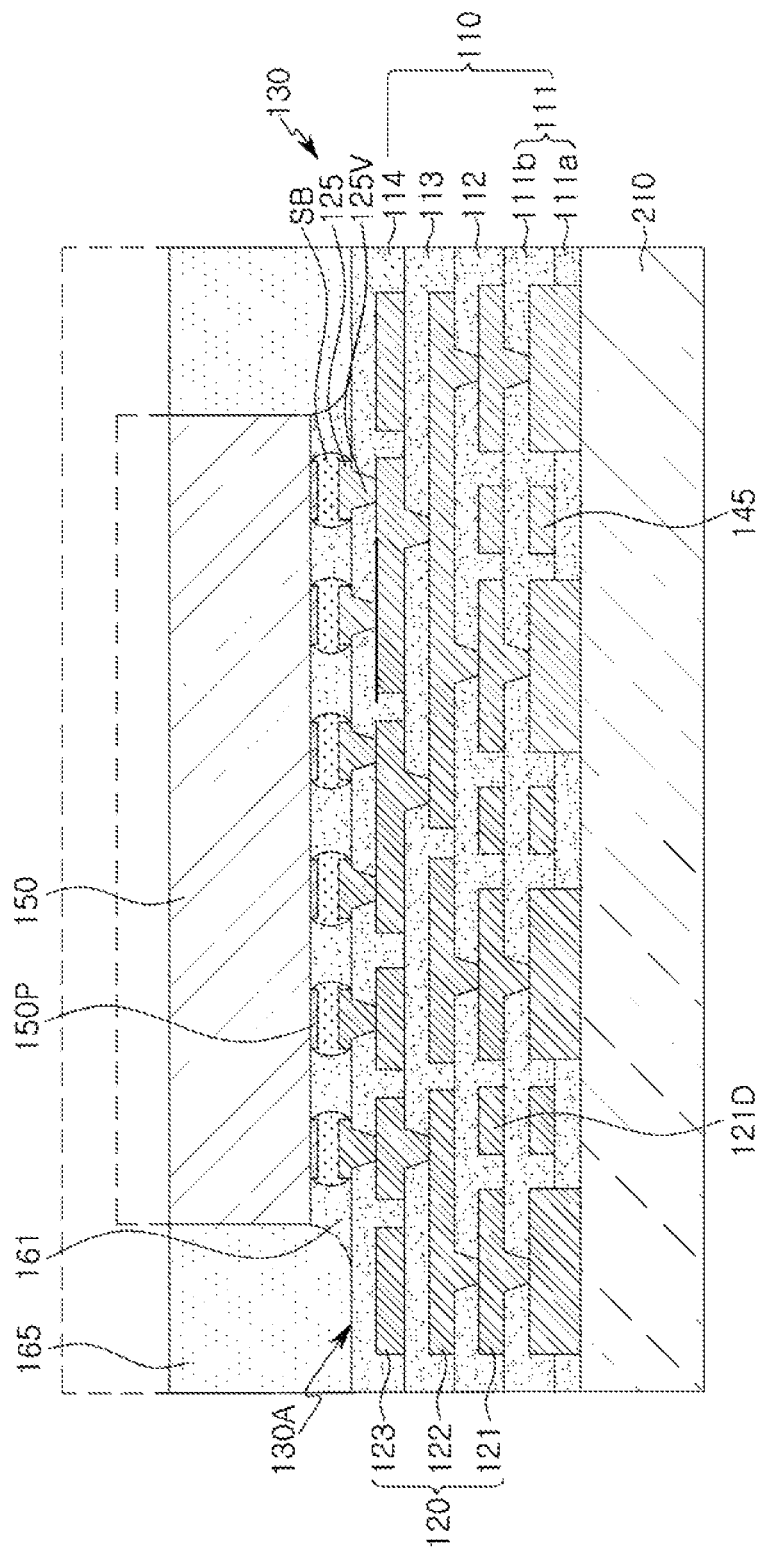

FIGS. 9A to 9C are cross-sectional views of stages in a method of manufacturing a semiconductor package according to an example embodiment.

The redistribution substrate 130 illustrated in FIG. 9A may be a redistribution substrate manufactured by the process illustrated in FIGS. 8A to 8G.

A plurality of bonding pads 125 connected to the redistribution layer 123 may be formed on the second surface of the redistribution substrate 130. Thereby, the semiconductor chip 150 may be electrically connected to the redistribution structure 120. A formation process of the bonding pad 125 may also be similar to a formation process of the redistribution layer. The bonding pad 125 may be connected to a redistribution layer 123 adjacent to the second surface 130B by a via portion 125V penetrating through an uppermost insulating layer 114.

Next, referring to FIG. 9B, a semiconductor chip 150 may be mounted on the second surface 130B of the redistribution substrate 130.

In the present process, contact pads 150P of the semiconductor chip 150 may be connected to bonding pads 125 disposed on the second surface 130B of the redistribution substrate 130 by connection bumps SB. An underfill resin 161 may be charged between the semiconductor chip 150 and the redistribution substrate 130. The underfill resin 161 may be formed to surround the side surface of the connection bump SB. The underfill resin 161 may include, e.g., an epoxy resin.

Next, referring to FIG. 9C, a molding portion 165 protecting the semiconductor chip 150 may be formed, and the upper surface of the semiconductor chip 150 may be exposed from the upper surface of the molding portion 165 using a grinding process.

For example, the molding portion 165 may be formed to cover the semiconductor chip 150 disposed on the redistribution substrate 130, and the upper surface of the molding portion 165 may be ground to expose the upper surface of the semiconductor chip 150 (a dashed line indicates a portion that is removed by a grinding process). Through the grinding process, an upper surface 150T of the semiconductor chip 150 may be exposed to improve heat dissipation and reduce the thickness of the semiconductor package. The upper surface of the semiconductor chip 150 may have a flat surface that is substantially coplanar with the upper surface of the molding portion 165. The molding portion 165 may include, e.g., an ABF.

The manufacturing method of the redistribution substrate illustrated in FIGS. 8A to 8G may include a formation process of a UBM pad using a plating process twice, but the UBM pad may be formed together with a dummy pattern in a single plating process.

FIGS. 10A to 10D are cross-sectional views of stages in a method of manufacturing a redistribution substrate according to an example embodiment.

Figure 10A:
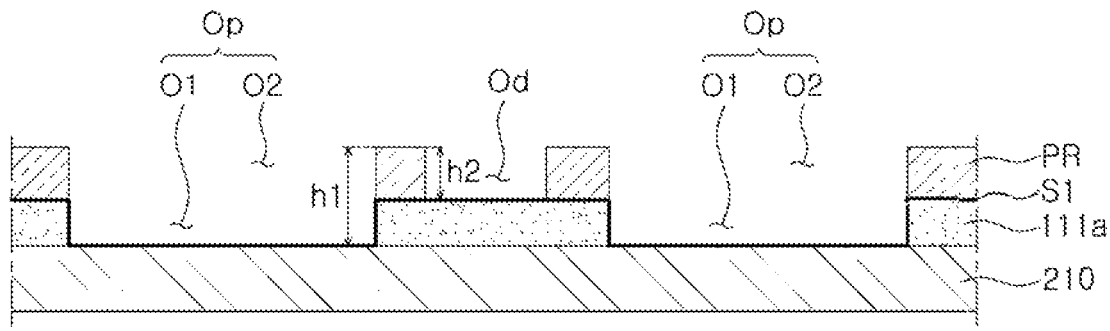
FIGS. 10A to 10D are cross-sectional views of stages in a method of manufacturing a redistribution substrate according to an example embodiment.

Referring to FIG. 10A, a first insulating film 111a having a plurality of first openings O1 may be formed. A photoresist film having a plurality of second openings O2 overlapping the plurality of first openings O1, respectively, and a dummy pattern opening Od disposed between the plurality of second openings O2, may be formed on the first insulating film 111a.

The plurality of overlapping first and second openings O1 and O2 may provide a plurality of UBM openings Op, respectively. Unlike the first photoresist film (PR1 of FIG. 8B) of the example embodiment described above, the photoresist film PR employed in the present example embodiment forms an opening Od for dummy pattern together with the second opening O2 before applying the plating process (that is, a primary plating process).

The depth h1 of the plurality of UBM openings Op corresponds to the sum of the thickness of the first insulating film 111a and the thickness of the photoresist film PR. The dummy pattern opening Od corresponds to the thickness of a photoresist film PR. The plurality of UBM openings Op may have a depth h1 greater than the depth h2 of the dummy pattern opening Od.

Figure 10B:
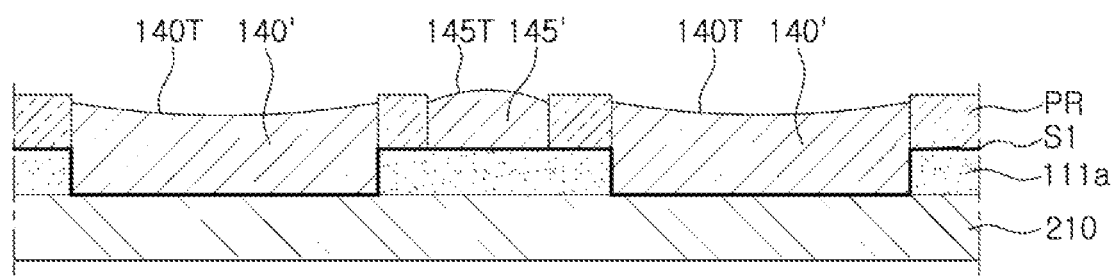

Next, referring to FIG. 10B, a plurality of UBM pads 140' and a dummy pattern 145' may be formed in the plurality of UBM openings Op and the dummy pattern openings Od, respectively.

The plurality of UBM pads 140 and the dummy pattern 145 may be formed using a plating process. In the present example embodiment, the dummy pattern 145' may be formed together with the UBM pad 140' using a single plating process. The present plating process may be performed by using the seed layer S1 regions exposed in the plurality of UBM openings Op and the dummy pattern openings Od, respectively.

As described above, a depth h1 of the plurality of UBM openings Op may be greater than a depth h2 of the dummy pattern openings Od. Therefore, when the plurality of UBM pads 140 'and the dummy pattern 145' are formed at the same time by using one plating process, there may be a slight height deviation. As shown in FIG. 10B, the plurality of UBM pads 140' may have a concave upper surface 140T ' if the plurality of UBM openings Op is not sufficiently filled. In contrast, the dummy pattern 145' may have a convex upper surface 145T' if the dummy pattern opening Od is slightly overfilled.

Figure 10C:
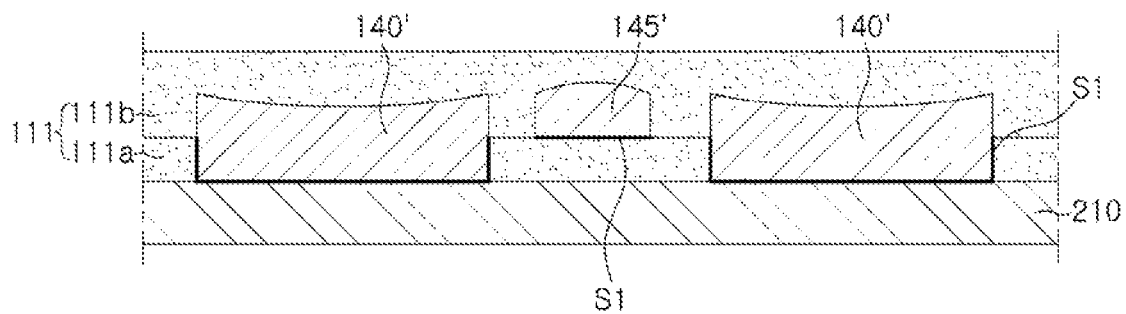

Referring to FIG. 10C, the photoresist film PR may be removed, and a second insulating film 111b may be formed on the first insulating film 111a to cover the plurality of UBM pads 140' and the dummy pattern 145'.

The second insulating film 111b may be provided as the lowermost insulating layer 111 associated with the UBM pad 140 together with the first insulating film 111a. For example, the second insulating film 111b may be a PID material similar to the first insulating film 111a. For example, the second insulating film 111b may be a PID material similar to the first insulating film 111a.

Figure 10D:
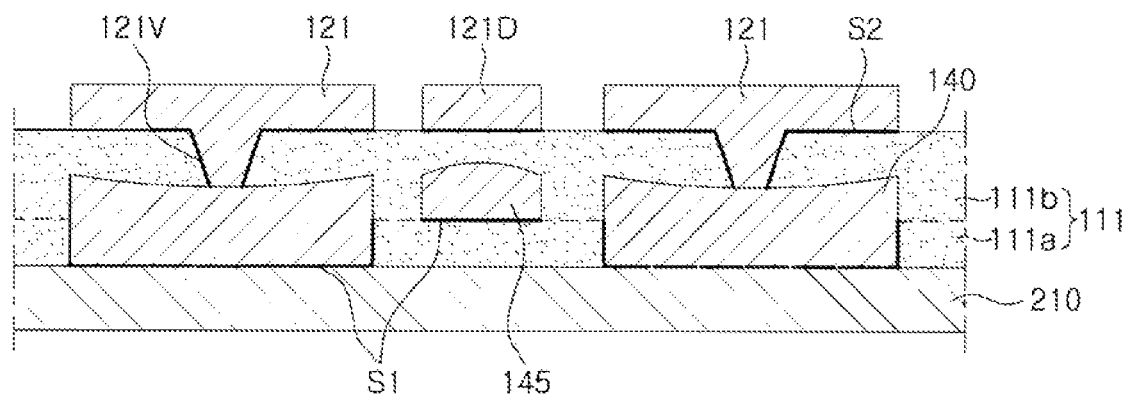

Referring to FIG. 10D, a redistribution layer 121 connected to the UBM pad 140' may be formed on the second insulating film 111b.

When the second insulating film 111b is PID, the redistribution layer 121 connected to the UBM pad 140 may be formed using a photolithography process and a plating process. For example, a hole connected to the UBM pad 140' may be formed for a photolithography process, a redistribution via 121V may be formed in the hole using a plating process, and a redistribution layer 121 connected to the redistribution via 121V may be formed in the second insulating film 111b.

In the present example embodiment, similar to the previous example embodiment, a second seed layer S2 may remain in the redistribution layer 121 along a surface in contact with the second insulating film 111b. A first seed layer S1 for the UBM pad 140 may be disposed between the plurality of UBM pads 140 'and the first insulating film 111a, but may not be present between the plurality of UBM pads 140' and the second insulating film 111b.

In addition, a portion of the first seed layer S1 for the dummy pattern 145' may be disposed between the dummy pattern 145' and the first insulating film 111a, but may not be present between the dummy pattern 145' and the second insulating film 111b.

The redistribution substrate 130 illustrated in FIG. 9A may be formed by repeatedly performing a formation process of the insulating layers 112, 113, and 114 and the redistribution layers 122, 123, and 125 described above.

Figure 11:
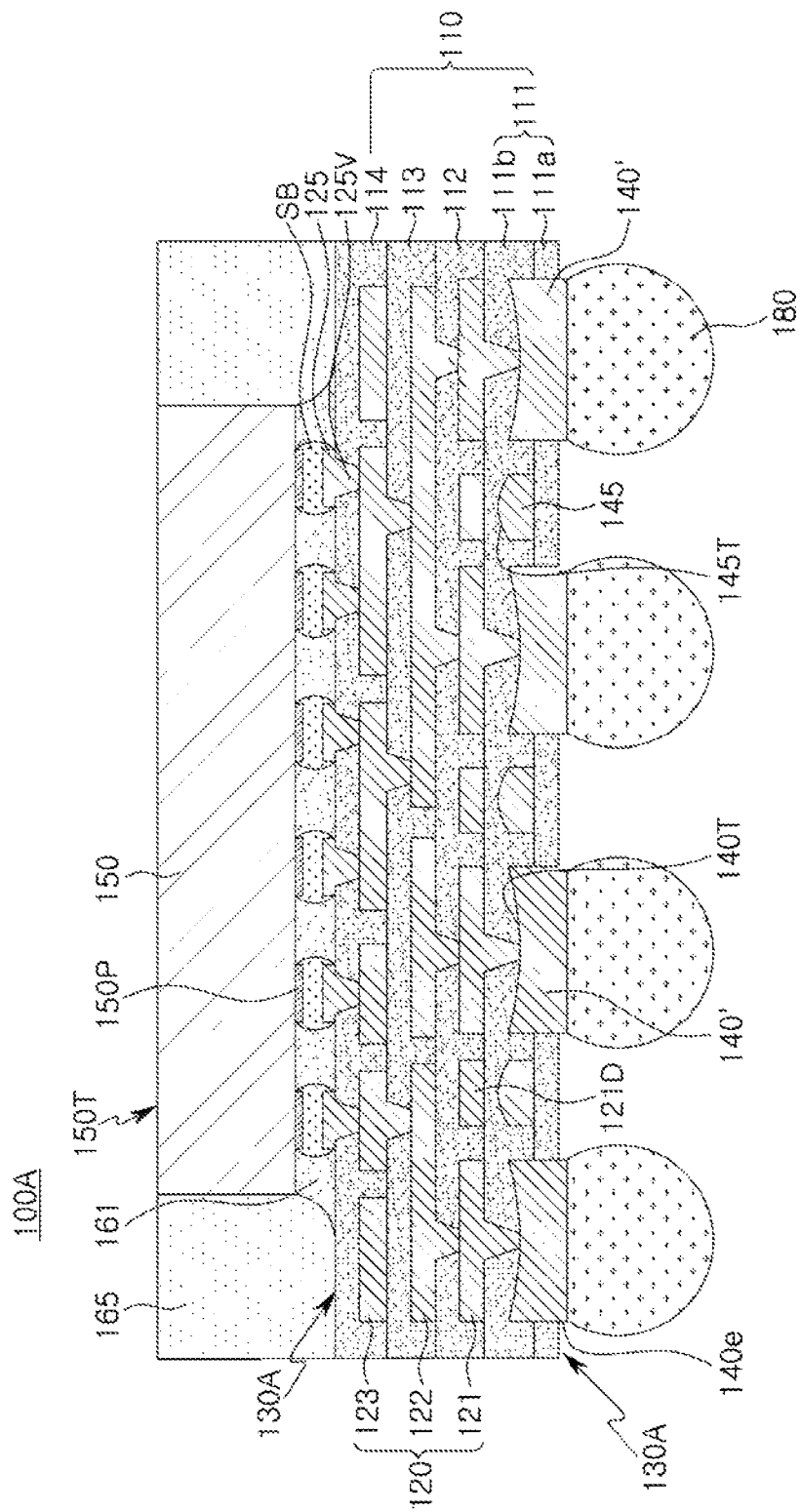
FIG. 11 is a cross-sectional view illustrating a semiconductor package according to an example embodiment.

FIG. 11 is a cross-sectional view illustrating a semiconductor package according to an example embodiment. The semiconductor package illustrated in FIG. 11 may include a redistribution substrate manufactured by the process illustrated in FIGS. 10A to 10D.

The structure illustrated in FIG. 11 may be the structures illustrated in FIGS. 1 to 3, except that in the semiconductor package 100A according to the present example embodiment, the UBM pad 140' and the dummy pattern 145' have a concave upper surface 140T' and a convex upper surface 145T', respectively, and some lower regions 140e of the UBM pad 140' are exposed. Accordingly, the description of the example embodiment shown in FIGS. 1 to 3 may be combined with the description of the present example embodiment unless otherwise stated.

The UBM pad 140' and the dummy pattern 145' in the present example embodiment may have a concave upper surface 140T 'and a convex upper surface 145T', respectively. As described in the foregoing process (see, FIG. 10B), the plurality of UBM pads 140' may have a concave upper surface 140T' if the plurality of UBM openings Op are not sufficiently filled, whereas the dummy pattern 145' may have a convex upper surface 145T' if the opening Od for dummy pattern is somewhat overfilled.

A de-scum or etching process using plasma or the like, may be performed on the first surface 130A of the redistribution substrate 130, and the lowermost insulating layer 111 may be partially etched, such that some lower regions 140e of the UBM pad 140' may be exposed. The exposed lower region 140e of the UBM pad 140 may ensure stable connection with the external connection conductor 180.

Figure 12:
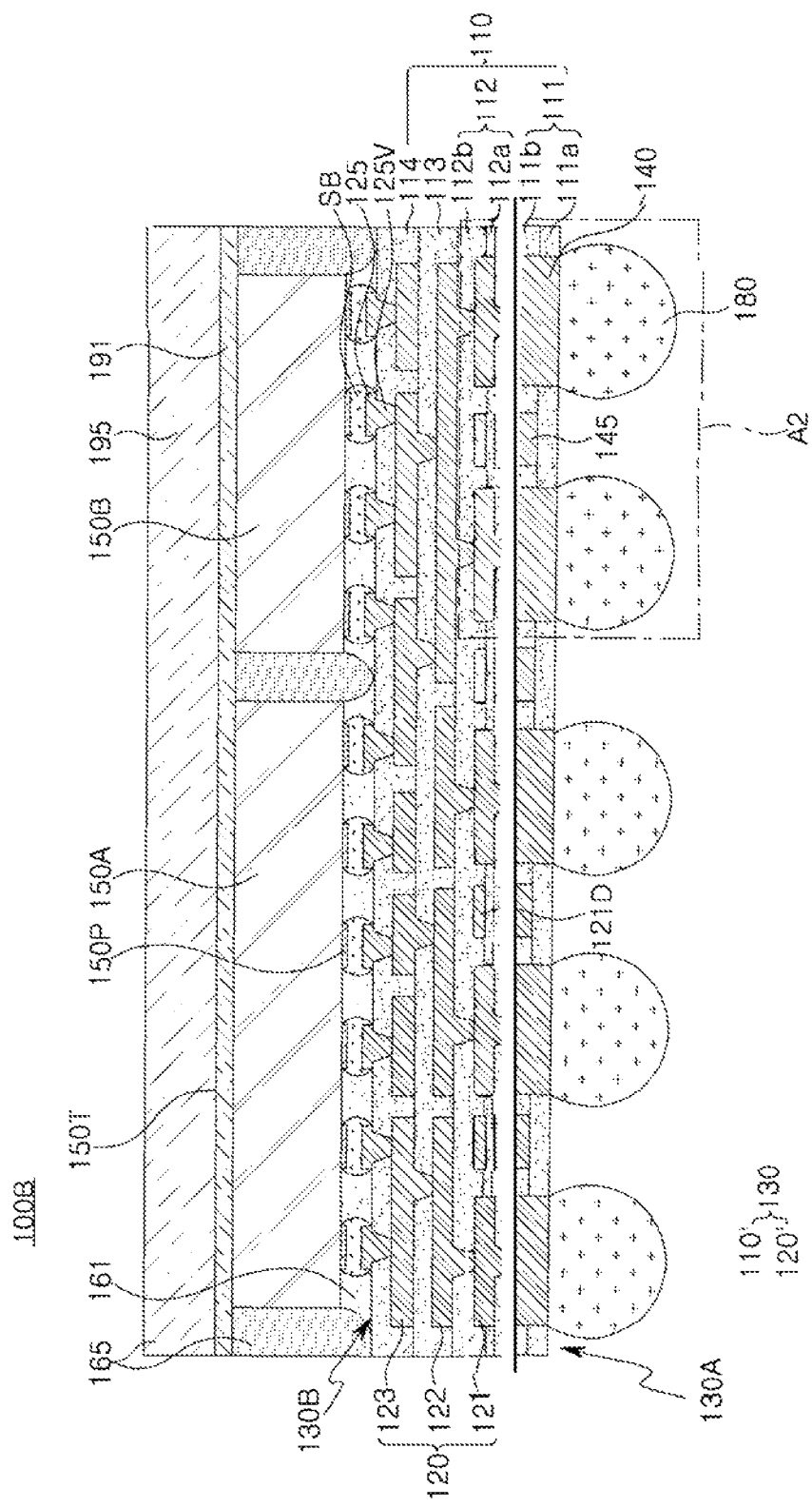
FIG. 12 is a cross-sectional view illustrating a semiconductor package according to an example embodiment.
Figure 13:
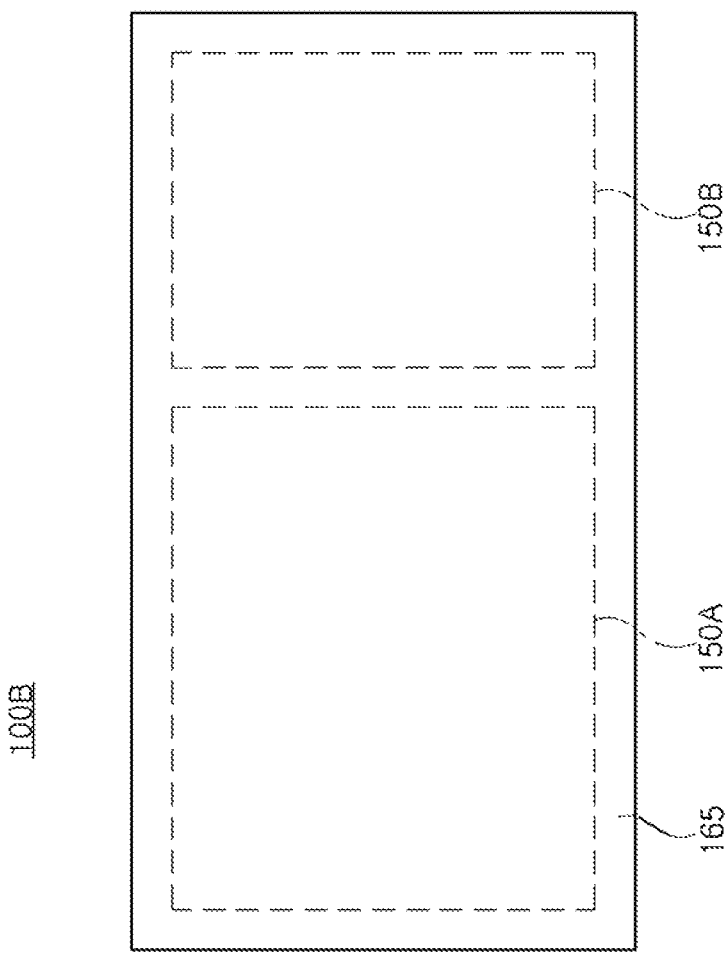
FIG. 13 is an upper plan view of the semiconductor package illustrated in FIG. 12.
Figure 14:
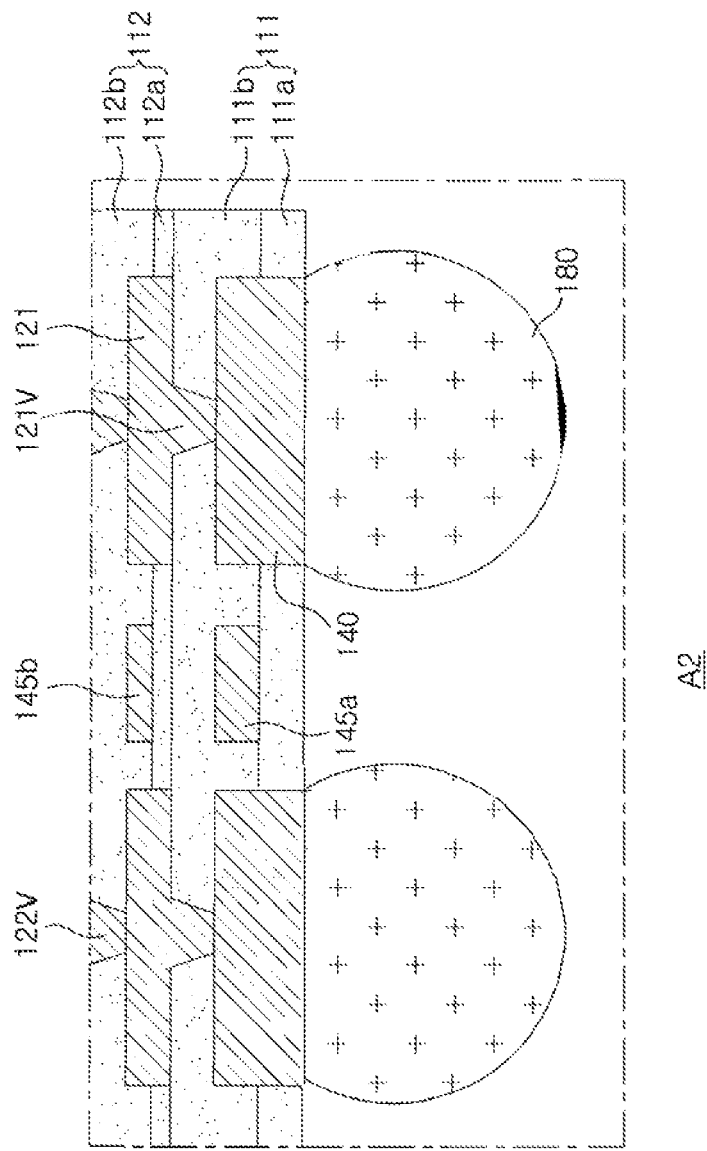
FIG. 14 is an enlarged cross-sectional view of a portion "A2" of the semiconductor package illustrated in FIG. 12.

FIG. 12 is a cross-sectional view illustrating a semiconductor package according to an example embodiment, FIG. 13 is an upper plan view of the semiconductor package illustrated in FIG. 12, and FIG. 14 is an enlarged cross-sectional view of a portion "A2" of the semiconductor package illustrated in FIG. 12.

The structures illustrated in FIGS. 12 and 13 may be similar to the structures shown in FIGS. 1 to 3, except that a second dummy pattern 145b for reducing undulation is introduced into some redistribution layers 121, and a plurality of semiconductor chips 150A and 150B and a heat sink 195 are included. Accordingly, the description of the example embodiment shown in FIGS. 1 to 3 may be combined with the description of the present example embodiment unless otherwise stated.

Similar to the dummy pattern 145 of the above-described example embodiment, a first dummy pattern 145a may be disposed between the plurality of UBM pads 140 in the insulating layer 111 to reduce undulation from the UBM pads 140. The first dummy pattern 145a may be spaced apart from the first surface 130A of the redistribution substrate 130, and may have a thickness smaller than that of the plurality of UBM pads 140. For example, the first dummy pattern 145a may be disposed between the first and second insulating films 111a and 111b of the lowermost insulating layer 111.

Referring to FIG. 14, a second dummy pattern 145b may be disposed on a level that is higher than a level of the plurality of redistribution layers 121 and between the plurality of redistribution layers 121. The second dummy pattern 145b may be spaced apart from the first surface 130A of the redistribution substrate 130, and may have a thickness smaller than the thickness of the redistribution layer 121. For example, the second dummy pattern 145b may be disposed between the first and second insulating films 112a and 112b of the insulating layer 112. When the redistribution layer 121 has a relatively larger thickness than the other redistribution layers or a distance between the redistribution layers 121 is large, the second dummy pattern 145b may be disposed to reduce the distance.

In the present example embodiment, first and second semiconductor chips 150A and 150B may be mounted on the second surface 130B of the redistribution substrate 130. The contact pad 150P of the first and second semiconductor chips 150A and 150B may be connected to the bonding pad 125 by connection bumps, respectively. A molding portion 165 may be formed to surround some or all of the first and second semiconductor chips 150A and 150B. The molding portion 165 may include, e.g., an epoxy molding compound. Similar to the previous example embodiment, the molding portion 165 may have a flat upper surface that is coplanar with upper surfaces of the first and second semiconductor chips 150A and 150B.

The semiconductor package 100B according to the present example embodiment may further include a heat conductive material layer 191 and a heat sink 195 sequentially disposed on the upper surfaces of the first and second semiconductor chips 150A and 150B. The heat conductive material layer 191 may be disposed between the heat sink 195, the first and second semiconductor chips 150A and 150B, and the molding portion 165. The heat conductive material layer 191 may help smoothly discharge heat, generated by the first and second semiconductor chips 150A and 150B, to the heat sink 195. The heat conductive material layer 191 may be made of, e.g., a thermal interface material (TIM).

The heat conductive material layer 191 may be made of, e.g., an electrically insulating material, or may be made of a material capable of maintaining electrical insulation including an insulating material. The heat conductive material 191 may include, e.g., an epoxy resin. Specific examples of the heat conductive material layer 191 may include mineral oil, grease, gap filler putty, phase change gel, phase change material pad pads, or particle filled epoxy.

The heat sink 195 may be disposed on the heat conductive material layer 191. The heat sink 195 may be, e.g., a heat sink, a heat spreader, a heat pipe, or a liquid cooled cold plate.

Figure 15:
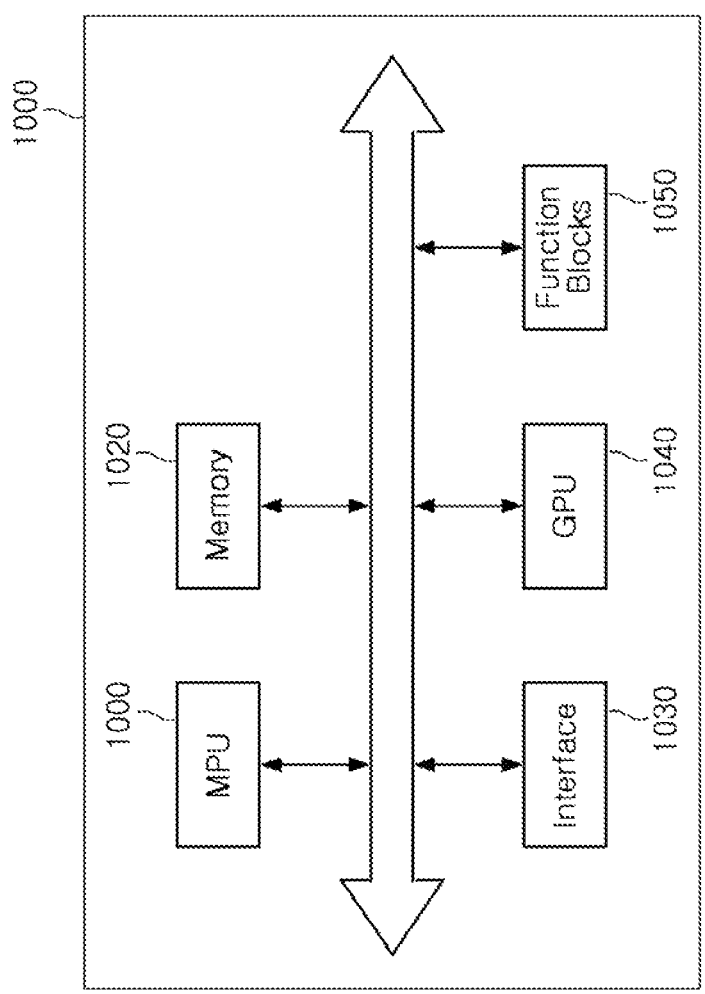
FIG. 15 is a block diagram illustrating a configuration of a semiconductor package according to an example embodiment.

FIG. 15 is a block diagram illustrating a configuration of a semiconductor package according to an example embodiment.

Referring to FIG. 15, the semiconductor package 1000 may include a micro processing unit 1010, a memory 1020, an interface 1030, a graphic processing unit 1040, functional blocks 1050, and a bus 1060 connecting thereto. The semiconductor package 1000 may include both the micro processing unit 1010 and the graphic processing unit 1040, or may include only one of the two.

The micro processing unit 1010 may include a core and an L2 cache. For example, the micro processing unit 1010 may include a multi-core. Each core of a multi-core may have the same or different performance. In addition, each core of the multi-core may be activated at the same time, or may be different from each other when activated.

The memory 1020 may store a result processed in the functional blocks 1050, and the like, under a control of the micro processing unit 1010. The interface 1030 may exchange information or signals with external devices. The graphic processing unit 1040 may perform graphic functions. For example, the graphic processing unit 1040 may perform a video codec or process 3D graphics. The functional blocks 1050 may perform various functions. For example, when the semiconductor package 1000 is an application processor (AP) used in a mobile device, some of the functional blocks 1050 may perform a communication function. In this case, the semiconductor package 1000 may include the semiconductor package 100B described with reference to FIG. 12.

By way of summation and review, a semiconductor package may be manufactured by forming a redistribution substrate (e.g., an interposer) having a redistribution layer, and mounting and molding a semiconductor chip on the redistribution substrate. The redistribution substrate may be formed by repeatedly performing a formation process of an insulating layer and a pattern of each layer (e.g., UBM pads and a plurality of redistribution layers) on each insulating layer.

As described above, embodiments may provide a semiconductor package having high reliability by improving undulation generated in a redistribution substrate. Embodiments may provide a method of manufacturing a semiconductor package having high reliability by reducing undulation in a redistribution substrate.

As described above, by introducing a dummy pattern that is not exposed to the outside between under bump metal (UBM) pads, undulation generated in a redistribution layer formed in a subsequent process may be reduced and reliability of a semiconductor package may be improved. In addition to the UBM pads, a dummy pattern may be disposed between the redistribution layers in a thinner layer than the redistribution layer to reduce undulation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a redistribution substrate having first and second surfaces, disposed opposite to each other, the redistribution substrate including an insulating member and a plurality of redistribution layers disposed at a plurality of different levels in the insulating member, respectively, and electrically connected to each other;
   a plurality of under-bump metallurgy (UBM) pads disposed in the insulating member and electrically connected to a redistribution layer, among the plurality of redistribution layers, that is adjacent to the first surface of the redistribution substrate, the plurality of UBM pads having lower surfaces with respect to the first surface of the redistribution substrate;

a dummy pattern disposed between the plurality of UBM pads in the insulating member, the dummy pattern having a lower surface located at a level higher than the lower surfaces of the plurality of UBM pads;

a plurality of external connection conductors disposed on the lower surfaces of the plurality of UBM pads respectively, and at least one semiconductor chip disposed on the second surface of the redistribution substrate and having a plurality of contact pads electrically connected to a redistribution layer, among the plurality of redistribution layers, adjacent to the second surface of the redistribution substrate, wherein:

the insulating member includes a first insulating film covering a first portion of a side surface of each of the plurality of UBM pads, the first portion adjacent the first surface of the redistribution substrate, and a second insulating film covering a second portion of the side surface of each of the plurality of UBM pads, the second portion above the first portion, the first portion is spaced apart from the first insulating film, the second portion is in direct contact with the second insulating film, and the semiconductor package further comprises a UBM seed layer disposed between the first portion and the first insulating film, and disposed between the lower surface of each of the plurality of UBM pads and each of the plurality of external connection conductors.

2. The semiconductor package as claimed in claim 1, wherein the dummy pattern is disposed on the first insulating film, and has a side surface covered by the second insulating film.

3. The semiconductor package as claimed in claim 2, wherein the side surface of the dummy pattern is in direct contact with the second insulating film.

4. The semiconductor package as claimed in claim 2, wherein a dummy seed layer is disposed between the lower surface of the dummy pattern and the first insulating film.

5. The semiconductor package as claimed in claim 1, wherein the dummy pattern is spaced by a distance of 30 μm or less from an adjacent UBM pad, among the plurality of UBM pads.

6. The semiconductor package as claimed in claim 1, wherein the dummy pattern is spaced by a distance of 2 μm or more from the first surface of the redistribution substrate.

7. The semiconductor package as claimed in claim 1, wherein the plurality of UBM pads have respective thicknesses that are greater than a thickness of the redistribution layer connected thereto.

8. The semiconductor package as claimed in claim 1, wherein a portion of each of the plurality of UBM pads protrudes from the first surface of the redistribution substrate.

9. The semiconductor package as claimed in claim 1, wherein the insulating member includes a photoimageable dielectric (PID) material.

10. The semiconductor package as claimed in claim 1, wherein:

the plurality of redistribution layers include a redistribution via connecting redistribution layers disposed at adjacent levels, and the redistribution via has a shape narrowed in a direction of the first surface of the redistribution substrate from the second surface of the redistribution substrate.

11. The semiconductor package as claimed in claim 1, further comprising a molding portion disposed on the second surface of the redistribution substrate, and surrounding the at least one semiconductor chip.

12. The semiconductor package as claimed in claim 11, further comprising a heat dissipation member disposed on the at least one semiconductor chip and the molding portion.

13. A semiconductor package, comprising:

a redistribution substrate having first and second surfaces, disposed opposite to each other, and including a plurality of insulating layers and a plurality of redistribution layers in the plurality of insulating layers, respectively, and electrically connected to each other;

a plurality of under-bump metallurgy (UBM) pads disposed in the plurality of insulating layers and electrically connected to the plurality of redistribution layers, the plurality of UBM pads having lower surfaces with respect to the first surface of the redistribution substrate;

a dummy pattern disposed between the plurality of UBM pads in the plurality of insulating layers, the dummy pattern having a lower surface located at a level higher than the lower surfaces of the plurality of UBM pads; and at least one semiconductor chip disposed on the second surface of the redistribution substrate and electrically connected to the plurality of redistribution layers, wherein:

the lower surface of the dummy pattern is spaced apart from the plurality of insulating layers by a seed layer for the dummy pattern, and a side surface of the dummy pattern is in direct contact with an insulating film.

14. The semiconductor package as claimed in claim 13, wherein the seed layer for the dummy pattern is not present between the side surface of the dummy pattern and the insulating film.

15. A semiconductor package, comprising:

a redistribution substrate having first and second surfaces, disposed opposite to each other, and including a plurality of insulating layers and a plurality of redistribution layers in the plurality of insulating layers, respectively, and electrically connected to each other;

a plurality of under-bump metallurgy (UBM) pads disposed in the plurality of insulating layers and electrically connected to the plurality of redistribution layers, the plurality of UBM pads having lower surfaces with respect to the first surface of the redistribution substrate;

a dummy pattern disposed between the plurality of UBM pads in the plurality of insulating layers, the dummy pattern having a lower surface located at a level higher than the lower surfaces of the plurality of UBM pads;

at least one semiconductor chip disposed on the second surface of the redistribution substrate and electrically connected to the plurality of redistribution layers;

first seed layers extending along side surfaces of the plurality of UBM pads; and second seed layers extending along the lower surface of the dummy pattern, wherein a first length of each of the first seed layers is shorter than a length of the respective side surfaces of the plurality of UBM pads, wherein the first length of each of the first seed layers and the length of the respective side surfaces are in a direction from the first surface of the redistribution substrate toward the second surface of the redistribution substrate.

16. The semiconductor package as claimed in claim 15, wherein a second length of each of the second seed layers is equal to a length of the lower surface of the dummy pattern, wherein the second length of each of the second seed layers and the length of the lower surface of the dummy pattern are in the direction from the first surface of the redistribution substrate toward the second surface of the redistribution substrate.

* * * * *